(12) United States Patent
Martin et al.

(10) Patent No.: US 7,943,411 B2
(45) Date of Patent: May 17, 2011

(54) APPARATUS AND METHOD OF WAFER BONDING USING COMPATIBLE ALLOY

(75) Inventors: John R. Martin, Foxborough, MA (US); Timothy J. Frey, Hudson, MA (US); Christine H. Tsau, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 80 days.

(21) Appl. No.: 12/434,772

(22) Filed: May 4, 2009

(65) Prior Publication Data

US 2010/0059835 A1    Mar. 11, 2010

Related U.S. Application Data

(60) Provisional application No. 61/095,754, filed on Sep. 10, 2008.

(51) Int. Cl.
*H01L 21/00*    (2006.01)
*H01L 21/30*    (2006.01)
*H01L 21/46*    (2006.01)

(52) U.S. Cl. ............ 438/50; 438/53; 438/455; 438/406

(58) Field of Classification Search .............. 438/50, 438/51, 52, 53, 455, 406
See application file for complete search history.

(56) References Cited

U.S. PATENT DOCUMENTS

| | | | |
|---|---|---|---|
| 3,949,118 A | 4/1976 | Nagano et al. | 427/57 |
| 4,499,655 A | 2/1985 | Anthony | 29/576 |
| 5,089,880 A | 2/1992 | Meyer et al. | 357/75 |
| 5,229,647 A | 7/1993 | Gnadinger | 257/785 |
| 5,326,726 A | 7/1994 | Tsang et al. | 437/228 |
| 5,355,022 A | 10/1994 | Sugahara et al. | 257/768 |
| 5,417,111 A | 5/1995 | Sherman et al. | 73/517 |
| 5,511,428 A | 4/1996 | Goldberg et al. | 73/777 |
| 5,610,431 A | 3/1997 | Martin | 257/415 |
| 5,620,931 A | 4/1997 | Tsang et al. | 438/50 |
| 5,693,574 A | 12/1997 | Schuster et al. | 437/225 |

(Continued)

FOREIGN PATENT DOCUMENTS

EP    1 219 565 A1    7/2002

(Continued)

OTHER PUBLICATIONS

Y. Tomita et al., *Advanced Packaging Technologies on 3D Stacked LSI Utilizing the Micro Interconnections and the Layered Microthin Encapsulation*, IEEE, May 29, 2001, pp. 347-355.

(Continued)

*Primary Examiner* — Chuong A. Luu
(74) *Attorney, Agent, or Firm* — Sunstein Kann Murphy & Timbers LLP

(57) ABSTRACT

A method of forming an inertial sensor provides 1) a device wafer with a two-dimensional array of inertial sensors and 2) a second wafer, and deposits an alloy of aluminum/germanium onto one or both of the wafers. The alloy is deposited and patterned to form a plurality of closed loops. The method then aligns the device wafer and the second wafer, and then positions the alloy between the wafers. Next, the method melts the alloy, and then solidifies the alloy to form a plurality of conductive hermetic seal rings about the plurality of the inertial sensors. The seal rings bond the device wafer to the second wafer. Finally, the method dices the wafers to form a plurality of individual, hermetically sealed inertial sensors.

6 Claims, 5 Drawing Sheets

U.S. PATENT DOCUMENTS

| | | | |
|---|---|---|---|
| 5,939,633 A | 8/1999 | Judy | 73/514.32 |
| 6,118,181 A | 9/2000 | Merchant et al. | 257/757 |
| 6,236,115 B1 | 5/2001 | Gaynes et al. | 257/774 |
| 6,297,072 B1 | 10/2001 | Tilmans et al. | 438/106 |
| 6,306,516 B1 | 10/2001 | Jin et al. | 428/469 |
| 6,307,169 B1 | 10/2001 | Sun et al. | 200/181 |
| 6,319,617 B1 | 11/2001 | Jin et al. | 428/469 |
| 6,323,550 B1 | 11/2001 | Martin et al. | 257/704 |
| 6,335,224 B1 | 1/2002 | Peterson et al. | 438/114 |
| 6,346,742 B1 | 2/2002 | Bryzek et al. | 257/704 |
| 6,384,353 B1 | 5/2002 | Huang et al. | 200/181 |
| 6,429,511 B2 | 8/2002 | Ruby et al. | 257/704 |
| 6,433,411 B1 | 8/2002 | Degani et al. | 257/678 |
| 6,436,853 B2 | 8/2002 | Lin et al. | 438/800 |
| 6,448,109 B1 | 9/2002 | Karpman | 438/108 |
| 6,448,622 B1 | 9/2002 | Franke et al. | 257/415 |
| 6,504,253 B2 | 1/2003 | Mastromatteo et al. | 257/758 |
| 6,621,168 B2 | 9/2003 | Sundahl et al. | 257/778 |
| 6,625,367 B2 | 9/2003 | Coult et al. | 385/131 |
| 6,753,208 B1 | 6/2004 | MacIntyre | 438/118 |
| 6,852,575 B2 * | 2/2005 | Bojarczuk et al. | 438/149 |
| 6,853,067 B1 | 2/2005 | Cohn et al. | 257/704 |
| 6,893,574 B2 | 5/2005 | Felton et al. | 216/2 |
| 6,906,395 B2 | 6/2005 | Smith | 257/417 |
| 6,909,146 B1 | 6/2005 | Linn et al. | 257/347 |
| 6,911,727 B1 | 6/2005 | Martin et al. | 257/704 |
| 6,933,163 B2 | 8/2005 | Yun et al. | 438/48 |
| 6,936,918 B2 | 8/2005 | Harney et al. | 257/704 |
| 6,962,835 B2 | 11/2005 | Tong et al. | 438/108 |
| 7,034,393 B2 | 4/2006 | Alie et al. | 257/704 |
| 7,104,129 B2 | 9/2006 | Nasiri et al. | 73/514.29 |
| 7,220,614 B2 | 5/2007 | Martin | 438/57 |
| 7,291,561 B2 | 11/2007 | Ma et al. | 438/691 |
| 7,329,056 B2 | 2/2008 | Sherrer et al. | 385/93 |
| 7,334,491 B2 | 2/2008 | Rudhard et al. | 73/866.1 |
| 7,442,570 B2 | 10/2008 | Nasiri et al. | 438/48 |
| 7,458,263 B2 | 12/2008 | Nasiri et al. | 73/504.12 |
| 2004/0219763 A1 | 11/2004 | Kim et al. | 438/455 |
| 2004/0232500 A1 | 11/2004 | Rudhard et al. | 257/414 |
| 2005/0003652 A1 | 1/2005 | Ramanathan et al. | 438/616 |
| 2005/0170609 A1 | 8/2005 | Alie et al. | 438/455 |
| 2005/0269678 A1 | 12/2005 | Martin et al. | 257/704 |
| 2006/0118946 A1 | 6/2006 | Alie et al. | 257/704 |
| 2006/0208326 A1 * | 9/2006 | Nasiri et al. | 257/414 |
| 2008/0237823 A1 | 10/2008 | Martin | 257/685 |
| 2008/0283990 A1 | 11/2008 | Nasiri et al. | 257/684 |
| 2008/0314147 A1 | 12/2008 | Nasiri et al. | 73/514.32 |
| 2008/0315334 A1 | 12/2008 | Martin | 257/415 |
| 2009/0007661 A1 | 1/2009 | Nasiri et al. | 73/504.03 |
| 2009/0029152 A1 * | 1/2009 | Yun et al. | 428/328 |

FOREIGN PATENT DOCUMENTS

| | | |
|---|---|---|
| EP | 1 296 374 A1 | 3/2003 |
| WO | WO 96/13062 | 5/1996 |
| WO | WO 00/37912 | 6/2000 |
| WO | WO 01/56921 A2 | 8/2001 |
| WO | WO 02/42716 | 5/2002 |
| WO | WO 02/093122 A2 | 11/2002 |
| WO | WO 2004/091838 | 10/2004 |
| WO | WO 2009/049958 | 4/2009 |

OTHER PUBLICATIONS

Boustedt et al., *Flip Chip as an Enabler for MEMS Packaging*, 2002 Electronic Components and Technology Conference, Apr. 2002, pp. 124-128.

Ok et al., *Generic, Direct-Chip-Attach MEMS Packaging Design with High Density and Aspect Ratio through-Wafer Electrical Interconnect*, 2002 Electronic Components and Technology Conference, Apr. 2002, pp. 232-237.

MEMS: *Mainstream Process Integration*, Ziptronix White Paper, 7 pages.

Teomim et al., *An Innovative Approach to Wafer-Level MEMS Packaging*, Solid State Technology, printed Dec. 2, 2002, 3 pages.

ShellBGA, www.shellcase.com/pages/products-shellbga.asp, printed Dec. 2, 2002, 2 pages.

Seeger et al., *Fabrication Challenges for Next-Generation Devices: Microelectromechanical Systems for Radio-Frequency Wireless Communications*, J. Microlith., Microfab., Microsyst., vol. 2, No. 3, Jul. 2003, pp. 169-177.

Park et al., *A Novel Low-Loss Wafer-Level Packaging of the RF-MEMS Devices*, 2002 IEEE, Feb. 2002, pp. 681-684.

Ok et al., *High Density, High Aspect Ratio Through-Wafer Electrical Interconnect Vias for MEMS Packaging*, 2003 IEEE Transactions on Advanced Packaging, vol. 26, No. 3, Aug. 2003, pp. 302-309.

Premachandran et al., *A Novel Electrically Conductive Wafer Through Hole Filled Vias Interconnect for 3D MEMS Packaging*, 2003 Electronic Components and Technology Conference, May 2003, pp. 627-630.

Ando et al., *New Packaging Technology for SAW Device*, Corporate Components Development Center, pp. 403-406, Dec. 1995.

Chavan et al., *A Monolithic Fully-Integrated Vacuum-Sealed CMOS Pressure Sensor*, 2000 IEEE, Apr. 2000, pp. 341-346.

Wolffenbuttel, *Low-Temperature Intermediate Au-Si Wafer Bonding; Eutectic or Silicide Bond*, Sensors and Actuators A 62 (1997) pp. 680-686.

Martin, *Wafer Capping of MEMS with Fab-Friendly Metals*, Analog Devices Inc., Micromachined Products Division, SPIE presentation, Jan. 19, 2007.

Li M. Chen, KuangYang, U.S. Appl. No. 12/436,569, entitled Nickel-Based Bonding of Semiconductor Wafers, USPTO, filed on May 6, 2009 , 30 pages.

Changhan Yun U.S. Appl. No. 12/398,774, entitled Low Temperature Metal to Silicon Diffusion and Silicide Wafer Bonding, USPTO, filed on Mar. 5, 2009, 34 pages.

Ko, et al, *Bonding Techniques for Microsensors, Micromachining and Micropackaging of Transducers*, pp. 198-208, 1985.

C.M.T. Law, et al, Microstructure Evolution and Shear Strength of Sn-3.5Ag-Re Lead-free BGA Solder Balls, City University of Hong Kong, pp. 60-65, 2004.

Le Liang, et al., *Effect of Cerium Addition to Board Level Reliability of Sn-Ag-Cu Solder Joint*, Samsung Semiconductor (China) R&D Co., Ltd, 4 pages, 2007.

X. Ma, et al., *High Reliable Solder Joints Using Sn-Pb-LA Solder Alloy*, National Key Laboratory of Reliability Physics of Electronic Product, pp. 63-66, 2001.

Min Pei, et al., *Effect of Rare Earth Elements on Lead-Free Solder Microstructure Evolution*, Georgia Institute of Technology, pp. 187-204, 2007.

Daniel T. Rooney, Ph.D, et al., *Metallurgical Analysis and Hot Storage Testing of Lead-Free Solder Interconnects: SAC versus SACC*, Flextronics International, pp. 89-98, 2008.

Min Pei, et al., *Creep and Fatigue Behavior of SnAg Solders With Lanthanum Doping*, IEEE Transactions on Components and Packaging Technologies, vol. 31, No. 3, pp. 712-718, Sep. 2008.

Yangshan Sun, et al., *Lead-free Solders Based on the Sn-8Zn-3Bi Ternary Alloy with Additions of In, Nd or La*, 6th International Conference on Electronic Packaging Technology, 5 pages, 2005.

Hareesh Mavoori, et al., *Universal solders for direct and powerful bonding on semiconductors, diamond, and optical materials*, Applied Physics Letters, vol. 78, No. 19, pp. 2976-2978, May 7, 2001.

Wang L, et al., *The evaluation of the new composite lead free solders with the novel fabricating process*, 2004 International Conference of the Business of Electronic Product Reliability and Liability, pp. 50-56, 2004.

C.M. Lawrence Wu, *A Promising Lead-free Material for Flip-Chip Bumps: Sn-Cu-RE*, City University of Hong Kong, pp. 17-26, Oct. 14-16, 2002.

Shinji Takayama, *Annealing Characteristics of Al-Light-Rare-Earth Alloy Thin Films for Microelectronic Conductor Lines*,Mat. Res. Soc. Symp. Proc., vol. 403, pp. 645-650, 1996.

Ramirez, et al., *Bonding nature of rare-earth containing lead-free solders*, Applied Physics Letters, vol. 80, No. 3, pp. 398-400, Jan. 21, 2002.

I. Perez-Quintana, et al., *An Aluminum-germanium eutectic structure for silicon wafer bonding technology*, Wiley-VCH Verlag GmbH & Co. KGaA, Weinheim, phys. Stat. col. (c) 2, No. 10, pp. 3706-3709, 2005.

Sungho Jin, *Rare-Earth-Enabled Universal Solders for Microelectro-mechanical Systems and Optical Packaging*, Journal of Electronic Materials, vol. 32, No. 32, pp. 1366-1370, Nov. 12, 2003.

Jack Martin, *Commercial MEMS Case Studies: The Impact of Materials, Processes and Designs*, Materials Research Society, 2008, 9 pages.

Jack Martin, *Commercial MEMS Case Studies: Market Drivers, Designs, Materials and Processes*, Jack Martin is with the Micromachined Produces Division of Analog Devices, Inc., Oct. 25, 2008, pp. 1-4.

Tung-Han Chuang, *Temperature Effects on the Whiskers in Rare-Earth Doped Sn-3Ag-0.5Ce Solder Joints*, Metallurgical and Materials Transactions A, vol. 38A, May 200.7, pp. 1048-1055.

Bao Vu, et al. *Patterned eutectic bonding with Al/Ge thin films for microelectromechanical systems*, American Vacuum Society, vol. 1, No. 4, Jul. 1996, pp. 2588-2594.

Wu, et al., *Properties of lead-free solder alloys with rare earth element additions*, Materials Science and Engineering, vol. 44, No. 1, Apr. 2004, pp. 1-44.

International Searching Authority, International Search Report—International Application No. PCT/US2009/053350, dated Oct. 29, 2010, together with the Written Opinion of the International Searching Authority, 14 pages.

International Searching Authority, International Search Report—International Application No. PCT/US2009/053360, dated Oct. 29, 2010, together with the Written Opinion of the International Searching Authority, 15 pages.

\* cited by examiner

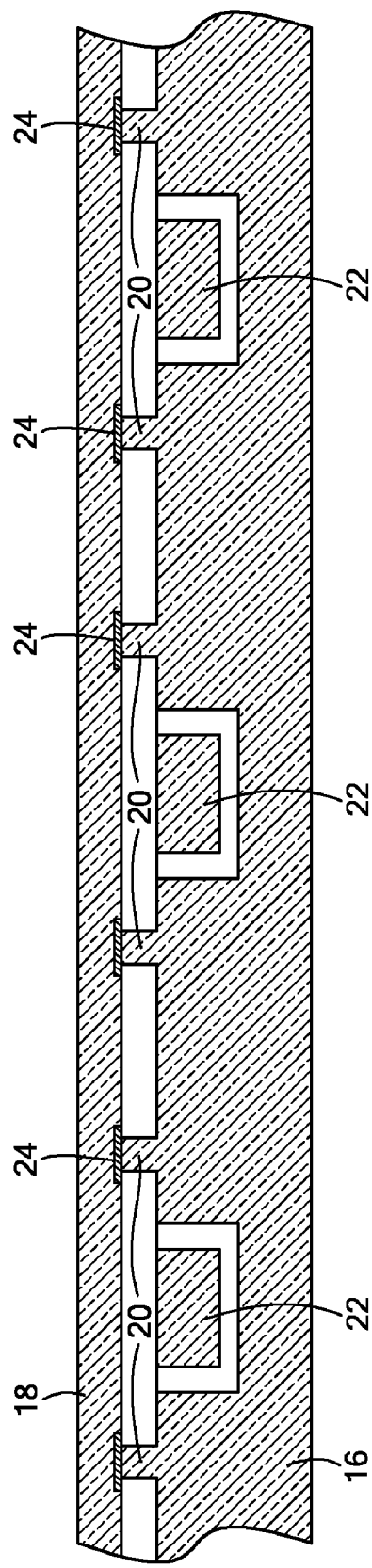
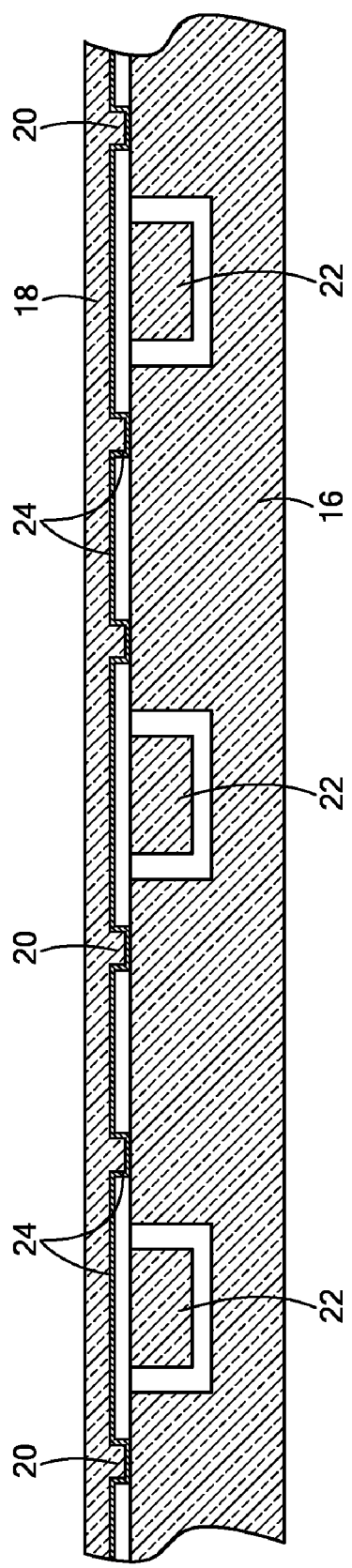

APPARATUS AND METHOD OF WAFER BONDING USING COMPATIBLE ALLOY

PRIORITY

This patent application claims priority from provisional U.S. Patent Application No. 61/095,754, filed Sep. 10, 2008, entitled, "SUBSTRATE BONDING WITH BONDING MATERIAL HAVING RARE EARTH METALS," and naming John R. Martin, Timothy J. Frey, and Christine Tsau as inventors, the disclosure of which is incorporated herein, in its entirety, by reference.

RELATED APPLICATION

This patent application is related to U.S. patent application Ser. No. 12/434,886, filed on even date herewith, entitled, "SUBSTRATE BONDING WITH BONDING MATERIAL HAVING RARE EARTH METAL," and naming John R. Martin, Christine H. Tsau, and Timothy J. Frey as inventors, the disclosure of which is incorporated herein, in its entirety, by reference.

FIELD OF THE INVENTION

The invention generally relates to MEMS devices and, more particularly, the invention relates to wafer xbonding MEMS devices.

BACKGROUND OF THE INVENTION

A wide variety of microchips use caps to protect their interior components. For example, micro-electromechanical systems ("MEMS devices") often have a cap to protect their fragile microstructure. Many MEMS devices typically have a glass seal to bond the silicon die caps to the underlying MEMS chip. Such a seal, which can be hermetic, may have widths on the order of about 150 to 400 microns. Undesirably, this seal footprint increases die size, especially when there is little or no support circuitry on the die. As a consequence, fewer dies/microchips can be formed from individual wafers, thus increasing per-unit fabrication costs.

Glass also can introduce contaminants and electrically isolate the cap from the die. Although the latter problem can be accommodated by wirebonding to the cap, such a solution increases package height. One alternative to using a glass seal involves use of a thermocompression bonded metal. Undesirably, however, thermocompression bonding generally requires relatively high bonding forces.

SUMMARY OF THE INVENTION

In accordance with one embodiment of the invention, a method of bonding a device wafer to a second wafer forms an aluminum layer on the device wafer, and a germanium layer on the second wafer. The aluminum layer has a majority concentration of aluminum, while the germanium layer has a majority concentration of germanium. The method continues by bringing the aluminum layer on the device wafer into contact with the germanium layer on the second wafer. Next, the method heats the layers to at least a pre-specified temperature to cause the aluminum layer to bond with the germanium layer. It should be noted that heating the layers causes at least some of the aluminum layer and at least some of the germanium layer to form an alloy having a melting temperature lower than that of either of the individual layers. In fact, heating can occur either before they are brought together, or afterward. The pre-specified temperature to which the intermediate apparatus is heated preferably is within about 75 degrees C. of the eutectic temperature. Finally, the method cools the wafers to form a plurality of hermetic seal rings between the wafers.

Optionally, the method also forms electrical connections between the wafers. These connections may be separate from, or integral with, the plurality of hermetic seal rings.

The method may use a number of different techniques for forming the aluminum layer and/or germanium layer, such as a sputter deposition process. In some embodiments, the seal rings have varying concentrations of aluminum, germanium, and aluminum/germanium eutectic. In that case, the region of the seal ring adjacent to the device wafer may have a higher concentration of aluminum than the region of the seal ring adjacent to the second wafer. In a corresponding manner, the region of the seal ring adjacent to the second wafer may have a higher concentration of germanium than the region of the seal ring adjacent to the device wafer.

Among other things, the device wafer may have a two dimensional array of MEMS structures, such as MEMS inertial sensors. The second wafer thus may have a corresponding two-dimensional array of caps. The caps can have no microstructure or circuitry, or may have one or both microstructure and circuitry. In addition, the inertial sensors may have microstructure only, or both microstructure and circuitry.

In accordance with another embodiment of the invention, a method of forming a MEMS structure, such as a capped inertial sensor, provides 1) a device wafer with a two-dimensional array of inertial sensors and 2) a second wafer, and deposits an alloy of aluminum/germanium onto one or both of the wafers. The alloy is deposited and patterned. The method then aligns the device wafer and the second wafer, and then positions the alloy between the wafers. Next, the method heats the alloy to within about 75 degrees C. of its melting temperature, with the wafers held in contact, with or without application of pressure, and then solidifies the alloy to form a plurality of conductive hermetic seal rings about the plurality of the inertial sensors. The seal rings bond the device wafer to the second wafer. Finally, the method dices the wafers to form a plurality of individual, hermetically sealed inertial sensors.

In a manner similar to other embodiments, this embodiment optionally also may form electrical connections between the wafers. Such connections may be separate from, or integral with, the seal rings.

In accordance with still another embodiment of the invention, a wafer bonding method provides 1) a device wafer with a two-dimensional array of MEMS devices and 2) a second wafer, and then deposits a metal alloy onto one or both the device wafer and the second wafer. The metal alloy is substantially CMOS fabrication plant compatible. The method then aligns the wafers and forms an intermediate apparatus having the metal alloy between the wafers. After heating the layers at least to a prescribed temperature within about 75 degrees C. of the melting point of the alloy, the method cools the contacting wafers to form a plurality of conductive hermetic seal rings about the plurality of the MEMS devices. The seal rings bond the device wafer to the second wafer.

In a manner similar to other embodiments, this embodiment optionally also may form electrical connections between the wafers. Such connections may be separate from, or integral with, the seal rings.

In accordance with other embodiments of the invention, a MEMS inertial sensor has a MEMS substrate with MEMS microstructure, a cap, and a substantially uniform metal alloy circumscribing the MEMS microstructure and securing the MEMS substrate to the cap. The metal alloy has a melting point of less than about 500° C. and is substantially CMOS fabrication plant compatible. The metal alloy, MEMS substrate, and cap form a hermetically sealed interior portion.

In accordance with still other embodiments of the invention, a wafer bonding method forms a first metal layer on a first wafer, and a second metal layer on the second wafer. The first metal layer may include one of aluminum-germanium or silicon-germanium, while the second metal layer may include one of aluminum, germanium, or aluminum-germanium. The method then aligns the first wafer and second wafer, bringing the first metal layer on the first wafer into contact with the second metal layer on the second wafer, and heats the layers to diffuse together the first and second metal layers to form a mechanical bond. After forming the bond, the method cools the wafers to form a plurality of hermetic seal rings between the wafers.

In a manner similar to other embodiments, this embodiment optionally also may form electrical connections between the wafers. Such connections may be separate from, or integral with, the seal rings.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 3A also schematically shows a plan view of a portion of one of those wafers.

FIG. 4 schematically shows a cross-sectional view of two wafers bonded in accordance with alternative embodiments of the invention.

FIG. 5 schematically shows a cross-sectional view of two wafers bonded in accordance with other embodiments of the invention.

DESCRIPTION OF ILLUSTRATIVE EMBODIMENTS

In illustrative embodiments, a MEMS fabrication method first deposits aluminum on a device wafer and germanium on a cap wafer, brings the aluminum layer into contact with the germanium layer, and then allows these materials to diffuse together, forming a plurality of lower temperature eutectic or near-eutectic aluminum-germanium seal rings. Each seal ring surrounds MEMS microstructure for one soon-to-be completed MEMS device. Accordingly, each seal ring hermetically seals its local microstructure and electrically connects the MEMS device with its cap.

Rather than applying aluminum and germanium separately, some embodiments apply an aluminum-germanium alloy to the device wafer, the cap wafer, or both wafers. Such embodiments should reduce fabrication time. Similar embodiments may apply a different alloy that, like aluminum-germanium, is substantially compatible with CMOS fabrication processes. These embodiments, whether they involve separate application of the constituent materials or an alloy, should provide a strong hermetic seal in a very narrow footprint (e.g., less than 100 microns, such as 50 microns). Accordingly, illustrative embodiments should decrease wafer area per individual die, consequently reducing per unit fabrication costs. Details of various embodiments are discussed below.

Figure 1:
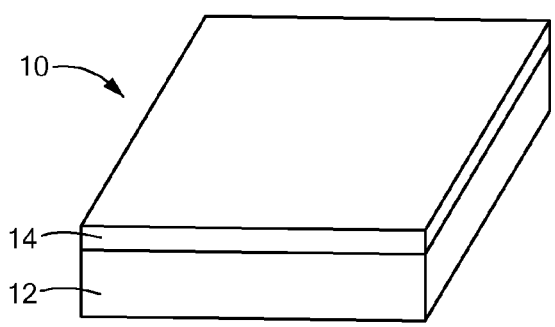
FIG. 1 schematically shows a capped microchip that may be fabricated in accordance with illustrative embodiments of the invention.

FIG. 1 schematically shows a perspective view of a capped microchip 10 fabricated in accordance with illustrative embodiments of the invention. To that end, the microchip 10 has a substrate 12 with functional elements (e.g., circuitry, MEMS microstructure, or both) and a cap 14 circumscribing some or all of the functional elements. For example, the microchip 10 may implement the functionality of an accelerometer, such as that of an ADXL202 iMEMS accelerometer or ADXL330 iMEMS accelerometer, both of which have been distributed by Analog Devices, Inc. of Norwood, Mass. The microchip 10 may implement other MEMS functions, such as other inertial sensors (e.g., gyroscopes), mechanical switches/relays, or optical MEMS switches. Accordingly, discussion of an accelerometer is for example only.

As known by those skilled in the art, the cap 14 protects the fragile microstructure on the substrate 12. It nevertheless should be noted that the cap 14 can have additional functionality. For example, the cap 14 can have its own microstructure, circuitry (e.g., CMOS circuitry), or both. In either case, the cap 14 protects the fragile MEMS microstructure on the substrate 12.

In accordance illustrative embodiments of the invention, the microchip 10 has a specially configured seal ring (shown in subsequent figures and generally shown in FIGS. 4-6 as bonding material 24) bonding the cap 14 to the substrate 12. The seal ring both electrically connects the substrate 12 to the cap 14, and hermetically seals the fragile microstructure. Specifically, the substrate 12, cap 14, and seal ring cooperate to form a hermetically enclosed area that protects the microstructure from the exterior environment. In alternative embodiments, the seal ring does not electrically connect the substrate 12 and cap 14.

As discussed in detail below, the inventors judiciously selected the seal ring material to increase device yield per wafer while being substantially compatible with CMOS fabrication processes. For example, some prior art processes (e.g., using glass frit) form several thousand MEMS devices on 150 millimeter wafers. To increase yield, such processes simply used larger wafers. Of course, increasing yield in this manner generally increases costs—larger wafers cost more. The inventors recognized that seal width of these prior art processes, which can be on the order of about 150-400 microns per device, significantly increased die size, thus reducing the die count per wafer. Material selection of these prior art processes limits seal width reduction.

The inventors realized that a metal seal should reduce the seal width and provide the necessary functionality (e.g., electrical interconnection of the cap 14 and substrate, hermeticity, etc . . . ). Selection of the appropriate metal, however, proved to be very challenging. First, the metal preferably is substantially compatible with CMOS fabrication processes. Specifically, wafer fabrication plants typically cost hundreds of millions of dollars to build. Exposure to even small amounts of certain metals can contaminate such plants, costing millions of dollars in losses. Use of metals that contaminate plants thus is highly undesirable. Accordingly, various embodiments select from metals customarily used in a CMOS wafer fabrication plant. Among others, those metals include aluminum, germanium, tungsten, and titanium.

Some CMOS compatible metals may require very high force bonding processes, which, in some instances, present technical challenges. The inventors thus recognized that formation of robust bonds requires atomic scale contact between the mating surfaces, and that the force required to achieve such contact can be reduced if the mechanical compliance of the interface is increased. They further recognized that such an increase can be achieved by using a metal or metal alloy that is near its melting point. They thus discovered that selection of an appropriate CMOS compatible alloy, including eutectic and near-eutectic compositions, should significantly reduce the required bond force. Furthermore, the inventors anticipate that such a selection allows formation of 5-30 micron wide seal rings using, for example, an aluminum-germanium alloy.

As noted above, use of these relatively narrow seal rings further reduces the required bond force.

Furthermore, many CMOS compatible metals also can adversely impact MEMS processing. For example, the metal can cause the movable mass to stick to its underlying substrate (known in the art as "stiction"). Other concerns include toxicity, deep trap contamination, and incompatibility issues. Details of some of those issues are discussed below.

Figure 2:
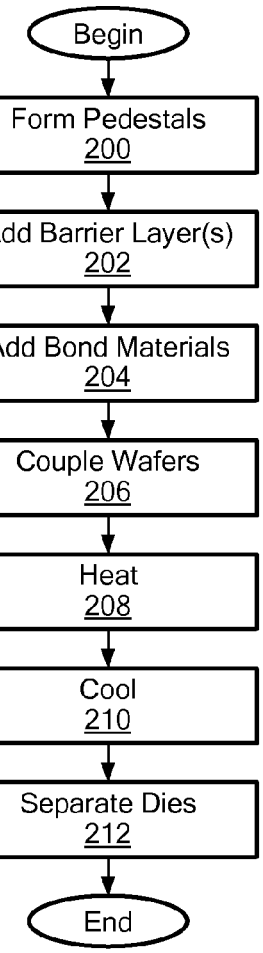
FIG. 2 shows a process of forming the capped microchip of FIG. 1 in accordance with illustrative embodiments of the invention.

FIG. 2 shows a process of forming the capped microchip 10 of FIG. 1 in accordance with illustrative embodiments of the invention. It should be noted that this method is a simplified summary of the overall process of forming the microchip 10 and thus, does not include a number of other steps that may be included, such as chip testing and preparation of certain equipment. Moreover, some steps may be performed in a different order or, in some instances, omitted.

In general, the process of FIG. 2 forms a plurality of microchips (e.g., the microchip 10 of FIG. 1) in parallel by simultaneously fabricating a two dimensional array of individual devices (e.g., MEMS devices) on a device wafer 16 (shown in FIGS. 3A-5, discussed below), and sealing each of those devices with caps 14 formed from a single cap wafer 18 (also shown in FIGS. 3A-5, discussed below). Some embodiments, however, process a single device at a time and thus, do not employ these noted batch processes.

The process of FIG. 2 begins at step 200, which forms pedestal rings 20 (also referred for simplicity as "pedestals 20") on the surface of the substrate 12. Specifically, FIGS. 3A-3D each schematically show a device wafer 16 having a two dimensional array of MEMS devices, and a cap wafer 18 for protecting the MEMS devices on the device wafer 16. The cap wafer 18 in this embodiment has a generally flat topography, while the device wafer 16 has a relatively complex topography. For example, if implementing MEMS accelerometers, the device wafer 16 generally may have a topology similar to that disclosed by U.S. Pat. No. 5,939,633, owned by Analog Devices, Inc. and incorporated herein, in its entirety, by reference.

Accordingly, conventional micromachining processes form each of the plurality of devices on the device wafer 16 to have, among other things, a plurality of springs (not shown) movably supporting a mass 22 above the substrate 12. FIGS. 3A-3D schematically show the mass 22 supported above the substrate 12 in this manner. The process also may form vias (not shown) and/or bond pads (not shown) to electrically connect with the mass 22 and/or circuitry of each device.

As noted above, illustrative embodiments form a plurality of pedestal rings 20 (also referred to for simplicity as "pedestals 20") that each generally circumscribe the movable mass 22 of one device. In other words, each device has at least one pedestal ring 20 around its mass 22. Alternatively, the pedestal ring 20 of a device may enclose more than one mass 22, and/or a device may have more than one pedestal rings 20. The pedestal rings 20 may be any shape, such as circularly shaped, rectangularly shaped, or irregularly shaped. To reduce process steps and improve efficiency, the method preferably forms the pedestals 20 as it forms the movable mass 22, springs, and other microstructure on the device wafer 16.

By way of example, the pedestals 20 may be formed by etching material from the device wafer 16. Accordingly, if the device wafer 16 is formed from single crystal silicon, then the pedestals 20 also are formed from single crystal silicon (i.e., because they are integral with and formed from the device wafer 16) and subsequently coated with aluminum or other suitable material (discussed herein). Alternatively, the method may form the pedestals 20 by disposing a material onto the device wafer 16 and using surface micromachining techniques. For example, the method may deposit silicon-germanium or polysilicon followed by an optional barrier material and aluminum onto the device wafer 16 to form the pedestals 20. In yet another embodiment, the method may secure separate, pre-made circumscribing components onto the device wafer 16.

If the cap wafer 18 is very close to the device wafer 16, then the two wafers effectively may form a capillary that wicks the bonding material 24 across the microstructure (if the bonding material 24 is in a liquid state). The height of the pedestals 20 and the surface wetting properties in this area thus should be controlled to avoid this undesirable consequence if the bonding material 24 is in a liquid state. One advantage of processing at a temperature below the melting point is that such capillary wicking effects are avoided. Specifically, if the bonding process is close to, but below, the melting point, the bonding material 24 should be relatively soft. Therefore, moderate force is sufficient to deform the bonding material 24 to accommodate normal variations in wafer topography. In this discussion, the term "melting point" refers to the temperature at which the solid begins to transition from a solid phase to a liquid phase, and such term is intended to broadly cover solid-liquid phase transitions, such as those that occur in mixtures near a eutectic point.

To reduce the chip real estate required for the seal ring being formed, illustrative embodiments form the pedestals 20 to have a very small width. For example, the pedestals 20 may have a width of about 100 microns or less (e.g., 20-30 microns).

After forming the pedestals 20, the process begins preparing the surface of the cap wafer 18 and/or the surface of the device wafer 16 to receive bonding material 24 that ultimately forms the seal ring. To that end, the process optionally adds a barrier layer (also referred to as an "adhesion layer") to the appropriate surface(s) (step 202). Specifically, as known by those skilled in the art, certain metals may not adhere to the underlying layers on the wafers 16 and 18. For example, the device wafer 16 may have an exposed oxide or exposed polysilicon for receiving the seal ring material.

Application of a barrier material thus should both facilitate material adhesion, while also preventing the diffusion of the seal ring material into underlying layers. Among other things, a titanium or titanium tungsten barrier layer should suffice on silicon. Similar or other materials may suffice on other surfaces. Those skilled in the art can select the appropriate barrier material as a function of the properties of the seal ring material and wafer material.

Next, the process adds bonding material 24 that ultimately forms at least part of the seal ring (step 204). In illustrative embodiments, the method adds materials that ultimately form a metal alloy seal ring. To that end, the method may add an appropriate metal alloy to one or both wafers, or constituent parts of each metal to each wafer 16 and 18.

Figure 3A:
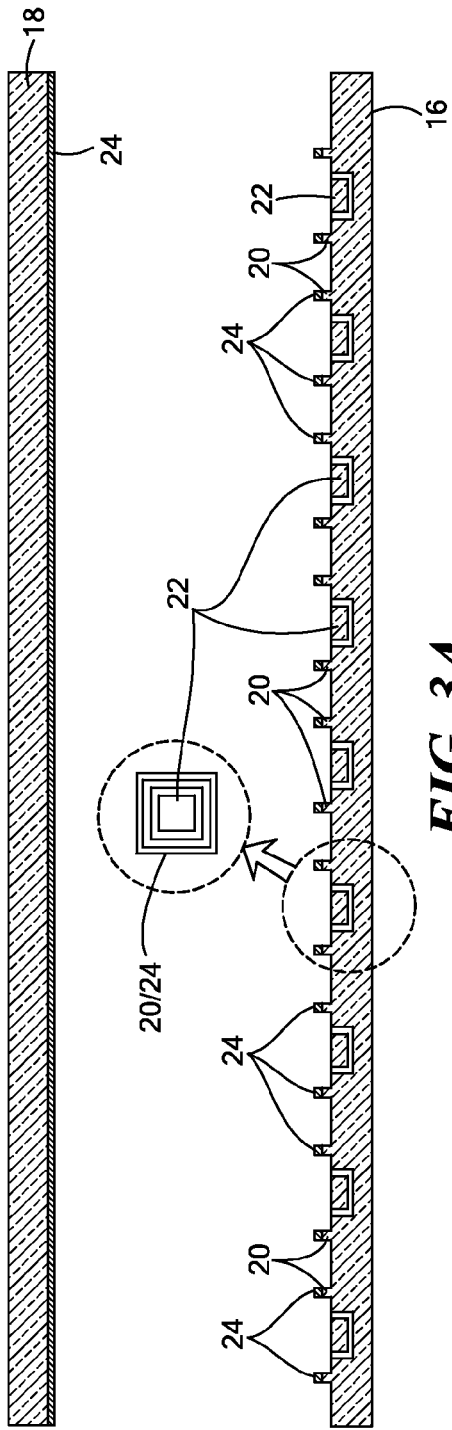
FIG. 3A schematically shows a cross-sectional view of two wafers to be bonded in accordance with one embodiment of the invention; namely, with one bonding material on the cap wafer and another bonding material on the device wafer.
Figure 3B:
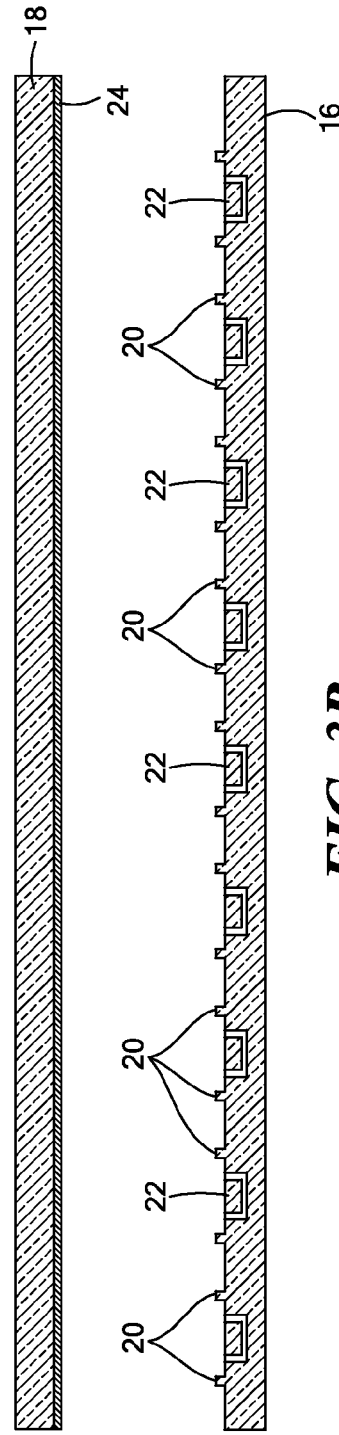
FIG. 3B schematically shows a cross-sectional view of two wafers to be bonded in accordance with a second embodiment of the invention; namely, with a metal alloy bonding material on the cap wafer only.

Continuing with the example of using aluminum and germanium, one embodiment may add germanium to the bottom-facing surface of the cap wafer 18, and aluminum to appropriate top-facing surfaces of the device wafer 16 (FIG. 3A). To that end, the method may sputter a layer of germanium, e.g., about 0.5 to two microns thick, onto the entire bottom surface of the cap wafer 18, and, from a second target, sputter a layer of aluminum, e.g., about 0.5 to two microns thick, onto the device wafer 16.

Appropriate surface micro-machining processes may pattern the two materials in any desired manner. For example, as shown in FIG. 3A, the aluminum may be patterned to contact only the top facing surface of the pedestal rings 20. Alternatively, the aluminum may extend to other parts of the device wafer 16.

Figure 3C:
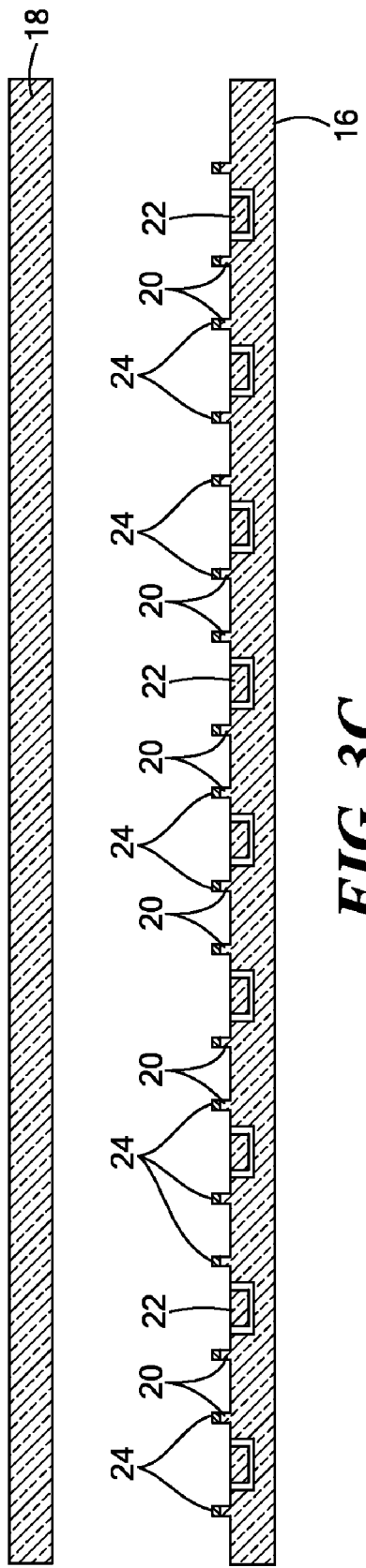
FIG. 3C schematically shows a cross-sectional view of two wafers to be bonded in accordance with a third embodiment of the invention; namely, with a metal alloy bonding material on the device wafer only.
Figure 3D:
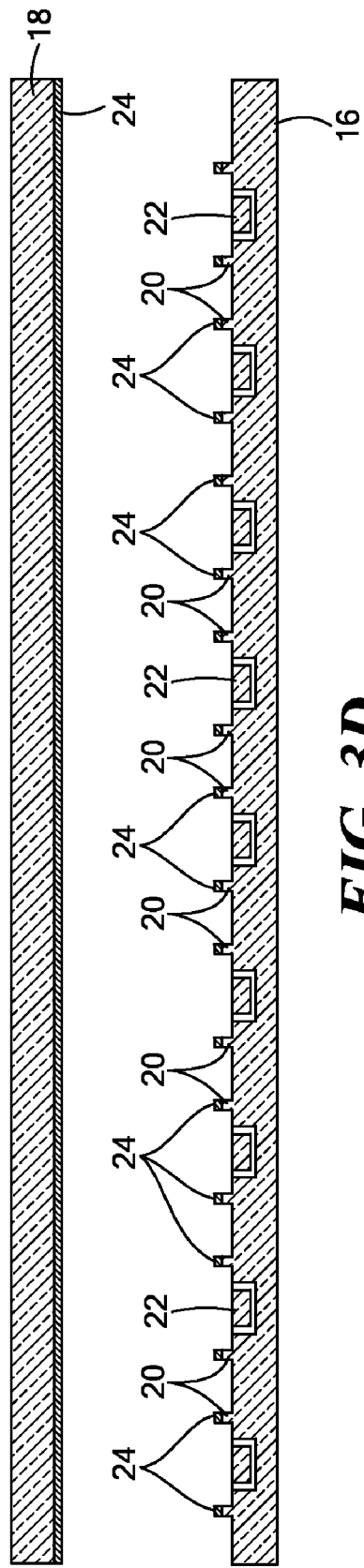
FIG. 3D schematically shows a cross-sectional view of two wafers to be bonded in accordance with a fourth embodiment of the invention; namely, with a metal alloy bonding material on both wafers.

Rather than applying aluminum to one surface and germanium to the other, some embodiments apply a metal alloy directly to one or both of the surfaces. For example, such embodiments may form a layer of aluminum-germanium on the cap wafer 18 (FIG. 3B) or the device wafer 16 (FIG. 3C). In such embodiments, the mating surface on the other wafer may have aluminum, silicon-germanium, aluminum-germanium, or any material that results in formation of an interface that produces a strong hermetic bond at the bonding temperature. To that end, conventional sputtering processes may sputter a 0.5 to four micron thick aluminum-germanium layer onto one (FIGS. 3B and 3C) or both surfaces (FIG. 3D) from an aluminum-germanium target. Sputtering the alloy onto the entire bottom surface of the cap wafer 18 should simplify fabrication to some extent since no subsequent patterning is necessary. There may be instances, however, when the bottom surface of the cap wafer 18 or the alloy deposited on this surface would be patterned.

FIG. 5 schematically illustrates an embodiment in which the bottom surface of the cap wafer, but not the deposited material, is patterned. Although sputtering processes were discussed for this and other materials, other processes may deposit this and other materials. For example, silicon-germanium films may be formed using one of several types of chemical vapor deposition processes.

As is common in the art, aluminum, germanium, silicon-germanium, and aluminum-germanium may contain a small amounts of other elements. For example, these metals or the alloy(s) may have 95 percent or greater of the stated element(s), and small amounts of other elements. In any event, the aluminum should have a majority of aluminum, the germanium should have a substantial majority of germanium, the aluminum-germanium should have a substantial majority of aluminum-germanium, and the silicon-germanium should have a majority of silicon-germanium.

It should be noted that discussion of a sputtering process is for simplicity only and thus, not intended to limit other embodiments of the invention. For example, some embodiments may apply the bonding material 24 using a transfer process. Accordingly, those skilled in the art may use other techniques for applying the bonding material 24 to the appropriate wafer 16 or 18.

It also should be noted that discussion of germanium, aluminum, and aluminum-germanium are discussed for many embodiments by example only. Any number of different alloys may be used, depending upon the application. As noted above, in addition to being CMOS fabrication compatible, toxicity, contamination, and other factors should be taken into consideration. For example, many applications require a lead-free alloy. In addition to discouraging use of lead, toxicity also discourages use of other materials, such as cadmium and mercury.

Further material constraints may arise in other applications. For example, as noted above, in stiction sensitive applications, alloy selection may be limited to metals having negligible vapor pressure at anticipated bonding temperatures. Devices with stringent electrical surface leakage requirements may have similar limitations. In addition, the exposed metal (i.e., the source of vapor) may be minimized by removing it from the cap wafer cavity surface. One of ordinary skill in the art thus should select the appropriate metal alloy based upon the intended application. For example, some embodiments may use 55 germanium-45 aluminum. Alloys having more than two elements also may suffice.

Alloys further may be selected based upon their eutectic temperature. High eutectic temperatures can add further complications. Low eutectic temperatures also can create problems. For example, one skilled in the art should consider the requirements of subsequent thermal exposures. For example, if the die will be packaged in plastic packaging using injection molding techniques, the alloy should be capable of withstanding temperatures of the injection molding process (e.g., 175 degrees C.).

To facilitate adhesion, some embodiments may form corresponding bonding rings of material (not shown) on the surface of one of the wafers. For example, the process may add the alloy to the cap wafer 18 and form aluminum rings on specified parts of the device wafer 16. When sufficiently heated and in contact, the aluminum bonding rings should integrate with the alloy, thus bonding the wafers 16 and 18.

Rather than using bonding rings for this purpose, some embodiments apply a relatively small percentage of rare earth metal to the base alloy. The method selects the appropriate percentage primarily based upon the bonding strength desired for the ultimate alloy. For example, the rare earth alloy may have a concentration of between about 0.1 and about 5.0 percent rare earth metal. More specifically, the rare earth alloy may have a concentration of between about 0.25 and about 2.5 percent rare earth metal. If not limited to CMOS compatible metals, such embodiments also may add a cover layer over the alloy, such as gold, to minimize oxidation of the rare earth metal. Alternatively, if CMOS compatibility is desired, this embodiment may add a thin cover layer of aluminum to the alloy to minimize oxide formation. See, for example, the above noted and incorporated patent application filed on even date herewith for additional information regarding use of the rare earth metal in the alloy.

After adding the bonding material 24, the process continues to step 206, which couples together the device and cap wafers 16 and 18. To that end, conventional processes may align the wafers 16 and 18 by any number of different processes, such as with either interstage or infrared alignment.

Due to the nature of the microstructure and bonding material 24, however, some embodiments (e.g., the embodiment of FIG. 3B, which has the alloy on the cap wafer 18 only) should not require precise alignment to bring the wafers together. At this stage, the two wafers and material between them may be referred to as an "intermediate apparatus."

The process then heats the two wafers to a temperature that is within about 75 degrees C. of the eutectic temperature of the alloy (step 208). This heating step may take place before the wafers 16 and 18 are brought into contact, or after they are brought into contact. For example, if the alloy is aluminum-germanium, which has a eutectic temperature of about 424 degrees C., then the process may heat the alloy to between about 349-499 degrees C. (e.g., between about 349 and 424 degrees C., or between about 424 and 499 degrees C.). In some illustrative embodiments, the selected temperatures and heating times will not liquefy the alloy, but merely soften it to facilitate bonding with the wafers.

After heating the intermediate apparatus for a prescribed time, the process moves to step 210, which permits the intermediate apparatus to cool for some duration. This duration may be very short or relatively long. Moreover, the cooling can be at room-temperature, some elevated temperature, or below room-temperature. In either case, the heating and cooling steps effectively form a plurality of seal rings between the wafers 16 and 18. In other words, each MEMS device (e.g., each accelerometer) on the device wafer 16 has at least one seal ring hermetically sealing its local microstructure.

It is anticipated that the seal ring of various embodiments will have a gradient of their constituent materials. Specifically, the concentration of the constituent materials may change as a function of the distance from either of the wafers 16 and 18. For example, the embodiment having germanium on the cap wafer 18 and aluminum on the device wafer 16 may have its highest concentration of germanium near/adjacent to the cap 14. In a similar manner, that embodiment may have its highest concentration of aluminum near/adjacent the device wafer 16.

The concentrations between the wafers 16 and 18 thus may have a varying concentration of each element, with the middle region presumably having a generally proportional concentration of each. If heated long enough, however, it is anticipated that the concentration of the constituent materials may be generally uniform. In contrast, the embodiments that apply the eutectic alloy are anticipated to have generally uniform concentrations of the constituent elements between the wafers 16 and 18, or at least a concentration corresponding to that of the target alloy.

The process concludes at step 212, which separates the dies from their respective wafers 16 and 18. Specifically, conventional dicing processes may cut the bonded wafers to produce a plurality of independent microchips 10. Among others, conventional saw or laser dicing processes may separate the dies 10.

Some embodiments may cut only one wafer, and then cut the other wafer at a subsequent processing step. For example, the method may cut the cap wafer 18 only, thus exposing a portion of the device wafer 16 (e.g., exposing bond pads). Subsequent testing processes may use these bond pads to test the microchips 10 before dicing the device wafer 16.

As noted above, illustrative embodiments may use any of a number of techniques for aligning the cutting mechanism with the two bonded wafers. For example, some embodiments may use infrared sensors or other optical applications from the sides of the device wafer 16. Other embodiments may remove some of the bonding material 24 before bonding, or selectively deposit the bonding material 24 onto the cap wafer 18 to facilitate alignment vision systems.

FIG. 5 schematically shows another embodiment with an opposite pedestal arrangement; namely, the pedestals 20 are formed on/from the cap wafer 18. To that end, this method may pattern and etch the cap wafer 18, and then deposit the bonding material 24 discussed above. Similar application techniques may be used. For example, conventional sputtering techniques may apply the bonding material 24 as a blanket coat, and optionally remove portions of it as shown in FIG. 4.

Alternatively, in this and other embodiments, the bonding material 24 may be stamped using a transfer printing process or a method such as that used for inkjet printing. For example, this process may use a solder film (hot wafer or molten solder). As an alternative step, the transfer equipment may scrub the wafer to ensure that surface oxide does not affect contact quality. Other embodiments may thin-film pattern and etch the bonding material 24.

Some embodiments use the bonding material 24 without the pedestals 20. Instead, in those cases, the bonding material 24 alone may act as the seal ring.

Figure 6:
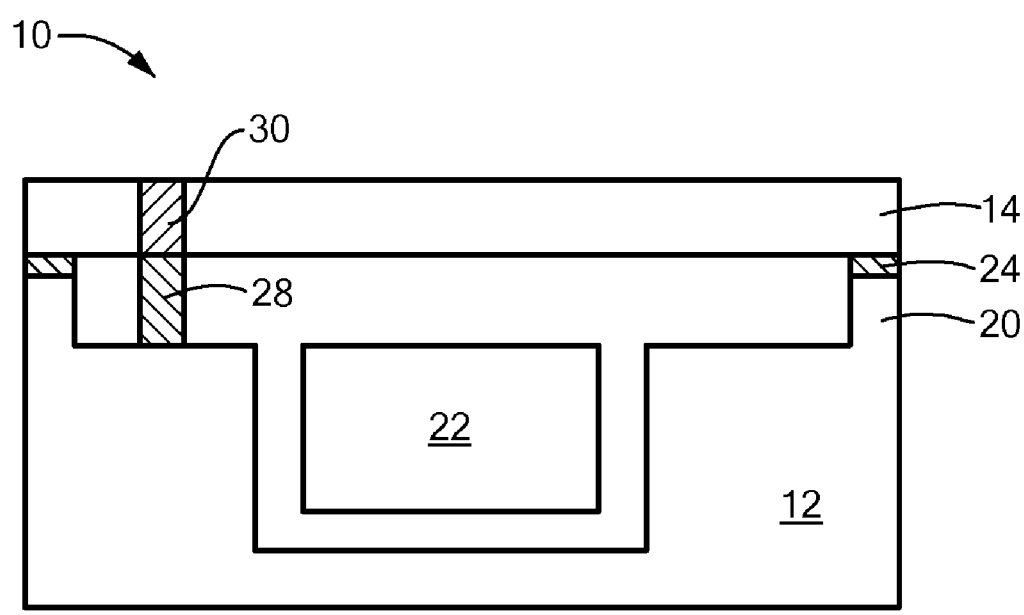
FIG. 6 schematically shows a cross-sectional view of one embodiment of the microchip of FIG. 1.

FIG. 6 schematically shows a cross-sectional view of one embodiment of the microchip 10 fabricated in accordance with illustrative embodiments. As shown, the microchip 10 has the noted seal ring coupling the cap 14 with the MEMS substrate 12. The cap 14, substrate 12, and seal ring hermetically seal the microstructure and are at substantially the same static potential.

This embodiment of FIG. 6 also has an additional feature; namely, a conductive path 28 extending from the substrate 12 to a via 30 within the cap 14. The conductive path 28 can be formed from the same material as that of the seal ring and thus, be formed at substantially the same time as the seal ring. Alternatively, the conductive path 28 can be formed from another alloy or metal that, preferably, also is CMOS fabrication compatible.

Accordingly, as noted above, various embodiments of the invention improve wafer yield without requiring designers to use larger wafers. Appropriate selection of the alloy (compatible with MEMS and CMOS fabrication processes) thus enables a narrow seal ring that both electrically connects the substrate 12 and cap 14 while hermetically sealing the fragile microstructure.

Optionally, various embodiments of the invention may also form mechanical connections that are not hermetic. For example, a cap positioned over a MEMS microphone diaphragm, and supported by a discontinuous ring or a set of standoffs, should provide mechanical protection to the fragile microphone diaphragm without blocking acoustic signals. Similarly, a cap positioned over a MEMS pressure sensing diaphragm or chemical sensor, and supported by a discontinuous ring or a set of standoffs, should provide mechanical protection to these fragile elements without blocking the media that is being sensed. These structures (i.e., microphones, pressure sensors, chemical sensors, etc. . . . ) are examples "non-hermetic structures" that may implement various embodiments of the invention.

Although the above discussion discloses various exemplary embodiments of the invention, it should be apparent that those skilled in the art can make various modifications that will achieve some of the advantages of the invention without departing from the true scope of the invention.

What is claimed is:

1. A method of bonding a MEMS device wafer to a second wafer, the method comprising:

forming an aluminum layer on the MEMS device wafer;
forming a germanium layer on the second wafer;
bringing the aluminum layer on the device wafer into contact with the germanium layer on the second wafer;
heating the aluminum layer and the germanium layer,
heating at least in part causing the aluminum layer and germanium layer to form a eutectic material, heating being initiated either before or after the aluminum layer is in contact with the germanium layer; and
cooling the wafers to form a plurality of hermetic seal rings between the wafers,
wherein at least one of the seal rings has varying concentrations of aluminum, germanium, or aluminum/germanium eutectic, the region of the seal ring adjacent to the device wafer having a higher concentration of aluminum than the region of the seal ring adjacent to the second wafer, the region of the seal ring adjacent to the second wafer having a higher concentration of germanium than the region of the seal ring adjacent to the device wafer.

2. The method as defined by claim 1 wherein forming an aluminum layer comprises using sputter deposition processes to form the aluminum layer on the device wafer.

3. The method as defined by claim 1 wherein forming a germanium layer comprises using sputter deposition processes to form the germanium layer on the second wafer.

4. The method as defined by claim 1 wherein the device wafer comprises a two dimensional array of MEMS inertial sensors, the second wafer comprising a corresponding two-dimensional array of caps.

5. The method as defined by claim 1 wherein heating comprises heating to between about 349 and 424 degrees C.

6. The method as defined by claim 1 wherein heating comprises heating to between about 424 and 499 degrees C.

* * * * *